(12) United States Patent
Momoto et al.

(10) Patent No.: US 7,368,380 B2
(45) Date of Patent: May 6, 2008

(54) METHOD OF MANUFACTURING SEMICONDUCTOR DEVICE

(75) Inventors: Seiji Momoto, Nagano (JP); Eiji Mochizuki, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 141 days.

(21) Appl. No.: 10/864,917

(22) Filed: Jun. 9, 2004

(65) Prior Publication Data

US 2005/0158979 A1    Jul. 21, 2005

(30) Foreign Application Priority Data

Jun. 9, 2003    (JP)    ............................. 2003-163401

(51) Int. Cl.
*H01L 21/44*    (2006.01)
*H01L 21/445*    (2006.01)

(52) U.S. Cl. ...................... 438/678; 438/462; 438/465; 438/454; 438/928

(58) Field of Classification Search ................ 438/401, 438/612, 613, 614, 652, 656, 678, 688, 113, 438/114, 462, 465, 454, 928
See application file for complete search history.

(56) References Cited

U.S. PATENT DOCUMENTS

| | | | | |
|---|---|---|---|---|
| 4,264,646 A | * | 4/1981 | Thornburg et al. | 427/98.5 |
| 4,464,673 A | * | 8/1984 | Patalong | 257/137 |
| 5,309,632 A | * | 5/1994 | Takahashi et al. | 29/852 |
| 5,338,967 A | * | 8/1994 | Kosaki | 257/620 |
| 5,986,338 A | * | 11/1999 | Nakajima | 257/700 |
| 6,181,569 B1 | * | 1/2001 | Chakravorty | 361/761 |
| 6,235,412 B1 | * | 5/2001 | Cheng et al. | 428/670 |
| 6,326,701 B1 | * | 12/2001 | Shinogi et al. | 257/797 |
| 6,329,288 B1 | * | 12/2001 | Tokushige et al. | 438/675 |
| 6,451,681 B1 | * | 9/2002 | Greer | 438/601 |
| 6,555,459 B1 | * | 4/2003 | Tokushige et al. | 438/612 |
| 6,596,611 B2 | * | 7/2003 | Lu et al. | 438/462 |
| 6,717,070 B2 | * | 4/2004 | Watanabe | 174/262 |
| 6,974,776 B2 | * | 12/2005 | Dean et al. | 438/678 |
| 2004/0256730 A1 | * | 12/2004 | Hirano et al. | 257/765 |

FOREIGN PATENT DOCUMENTS

| | | | |
|---|---|---|---|
| JP | 55-153330 A | * | 11/1980 |
| JP | 64-002357 | | 1/1989 |
| JP | 5-291186 (A) | | 11/1993 |
| JP | 5-47479 | | 12/1993 |
| JP | 5-335600 (A) | | 12/1993 |
| JP | 11-17197 (A) | | 1/1999 |
| JP | 2000-216410 | | 8/2000 |

* cited by examiner

*Primary Examiner*—M. Wilczewski
(74) *Attorney, Agent, or Firm*—Rossi, Kimms & McDowell, LLP

(57) ABSTRACT

A method of manufacturing a semiconductor device is disclosed in which a metallic deposit is stably formed on the anode side with small variation in film thickness, and plating is prevented on the cathode side without carrying out any additional processing on the cathode side. The processed anode side causes no interference in subsequent processing. Insulator films are used to cover a scribe line, as well as a field plate or an open electrode provided on a surface of a silicon substrate before Ni electroless plating of an aluminum electrode is performed to form a metallic deposit on the electrode.

5 Claims, 10 Drawing Sheets

METHOD OF MANUFACTURING SEMICONDUCTOR DEVICE

This application claims priority from Japanese application JP PA 2003-163401, filed on Jun. 9, 2003, the contents of which are incorporated by reference herein in their entirety.

BACKGROUND OF THE INVENTION

A. Field of the Invention

The present invention relates to a method of manufacturing a semiconductor device in which method an electrode is formed by an electroless plating method on a semiconductor device as a rectifying element such as a diode.

B. Description of the Related Art

In an electric power converter device for converting direct current to alternating current or vice versa such as an inverter or a converter, a rectifying element formed of a single element semiconductor chip is used as a free wheeling diode in being connected to a power semiconductor element in inverse parallel for current free wheeling.

A cross section of a unit cell structure of the diode is shown in FIG. 8. In FIG. 8, on one of surfaces of N-type silicon substrate 1, P-type diffused layer 2 is selectively formed. Around a perimeter of the surface, insulator film 3 such as an oxide film is formed so as to surround P-type diffused layer 2. On the surface of P-type diffused layer 2, aluminum electrode 4 is formed as an anode electrode so that an aluminum wire is easily bonded thereto. Furthermore, in a planar structure easily complying with a wafer on a trend toward an enlarged diameter, a plurality of ring-like P-type guard ring regions are formed on a wafer so as to surround respective P-type diffused layer 2 in active regions. In contact with each of the guard ring regions, a metal layer is formed as a voltage withstanding structure which layer is a field plate spreading toward the perimeter on the insulator film. The metal layer in the voltage withstanding structure section becomes open electrode 5 that is connected to no external circuit. Moreover, on the other surface, a cathode electrode is formed. The electrode is generally formed of a plurality of films made up of Ti layer 6, Ni layer 7 and Au layer 8 in the order from the silicon substrate side so that soldering is easily carried out on the surface. In addition, on the anode side surface of the silicon substrate, scribe lines are scored in a lattice for separating the silicon substrate into chips of rectifying elements after the rectifying elements are formed. Each of the scribe lines is provided on P-type diffused layer 2 and further reaches P-type diffused layer 2 through open electrode 5 to be at a potential of the anode.

The diode is operated as follows. An applied potential to the anode side as being higher than that to the cathode side brings the diode into conduction, and in reverse, the applied potential to the anode side as being lower than the cathode side brings the diode out of conduction, which makes the diode operated as being a rectifying element.

For streamlining a process when manufacturing the rectifying element, there is a requirement of forming the metal film on the electrode by soldering that can treat large numbers of electrodes at one time. Furthermore, for streamlining a process when assembling the rectifying element into a module or a molded package, there is also a requirement of carrying out connection of a lead terminal to the electrode on the anode side by soldering instead of wire bonding. When soldering the lead terminal to the electrode on the anode side, it is necessary to apply Ni also to the aluminum face on the anode side, since solder will not adhere to the aluminum face. One such Ni application method entails selectively forming an electrode by electroless plating (see JP-A-2000-216410, JP-A-11-17197, JP-A-5-291186, and JP-A-5-335600).

A cross sectional view of a unit cell structure of a diode with electrodes formed by such a method is presented in FIG. 9. In FIG. 9, on a surface of aluminum electrode 4 as an anode electrode, Ni metallic deposit 9 is formed. In general, however, in order to prevent Ni metallic deposit 9 from being oxidized, Au metallic deposit 10 is further formed thereon.

Since the metallic deposits are formed on metal electrodes, the metallic deposits also may form on a surface of open electrode 5 and the bottom surface of the cathode besides the surface of aluminum electrode 4 to be the anode electrode. The metallic deposits formed also on the surface of open electrode 5 and the bottom surface of the cathode cause the metal electrode films to be thickened. This increases the effect of the difference in coefficient of thermal expansion between the metal electrode film and N-type silicon substrate 1, causing an increased amount of warping of the wafer.

Moreover, as shown in a cross sectional view in FIG. 10, there is further requirement of stably forming Ni metallic deposit 9 and Au metallic deposit 10 on not only the anode electrode side but also the cathode electrode side. In this case, between Ni metallic deposit 9 and N-type silicon substrate 1, a metal electrode such as aluminum electrode 4 intervenes.

Furthermore, a plurality of diode regions are formed on a silicon substrate and connected to external circuits except diode regions with faulty characteristics (see JP-UM-B-5-47479 and JP-B-5-57744).

Vapor deposition can be also be used to form the metal electrode. In vapor deposition, a barrier can be provided on Ni as a substrate to make it possible to stop growth of an alloy of Ni and applied solder in Ni metallic deposit 9. Therefore, Ni metallic deposit 9 can be as thin as about 0.7 µm. However, from the standpoint of ease of formation of a metal electrode film onto a face with a complicated form having steps or from the standpoint of mass productivity, vapor deposition is incomparably inferior to electroless plating. Thus, electroless plating is desirable for formation of electrodes from the view point of cost reduction by mass production. In spite of this, Ni metallic deposit 9 formed by electroless plating is inferior in its ability to prevent growth of an alloy of Ni and applied solder as compared with vapor deposition, so that Ni metallic deposit 9 must have a thickness of as much as about 3 µm. Therefore, when electroless plating is used, plating on the bottom surface of the silicon substrate, or other areas where plating is not desired, produces a thick metallic deposit that increases the effect of a difference in coefficient of thermal expansion between the thick metallic deposit and the silicon substrate. This results in an increase in an amount of warping of the wafer to produce a problem of breaking the silicon substrate due to resulting stress in the worst case.

In order to prevent the increase in stress, an oxide film is left on the bottom face of the silicon substrate or the bottom face is covered with a tape to keep the bottom face free from adhesion of Ni. This, however, results in extra process steps by the additional step of removing the oxide film or stripping the tape, as well as possible lack of strength of the silicon substrate at tape stripping, and furthermore, degradation in film quality due to film contamination by an adhesive of the tape dissolved into plating solution.

In electroless plating of Ni, metallic ions $Ni^+$ positively charged in plating solution adhere to material to be plated due to slight electric potential difference between the metallic ions and the material to be plated, and grow as metallic Ni. In a rectifying element in which a P—N junction is formed, a P-type section is negatively charged and an N-type section is positively charged by a diffusion potential at the P—N junction. Therefore, the metallic ions tend to adhere easily onto an anode electrode of P-type to form a metallic deposit. Observation of situation of adhesion of a metallic deposit reveals that the metallic deposit grows only on the surface of the anode side in an early stage in which no short circuit is formed between the anode side and the cathode side. At this time, the metallic deposit also grows on a scribe line at the same potential as that of the anode. After a while, as the metallic deposit grows on the scribe line and then also on the perimeter of the wafer, the anode and the cathode are short-circuited by the metallic deposits grown via the perimeter of the wafer, and the metallic deposit grows immediately also on the cathode side. This immediately grown metallic deposit results in a very unstable film of metallic deposit with a variation in film thickness.

The present invention is directed to overcoming or at least reducing the effects of one or more of the problems set forth above.

SUMMARY OF THE INVENTION

Accordingly, in view of the above problems, it is an object of the present invention to provide a method of manufacturing a semiconductor device in which a metallic deposit is stably formed on the anode side with only a small variation in film thickness, and plating is prevented on the cathode side without the need for any additional processing on the cathode side. The processed anode side causes no interference in subsequent processing.

According to the invention, a metal electrode is provided on each surface of a semiconductor substrate, a scribe line is formed on one of surfaces of the semiconductor substrate, and after the scribe line is covered with an insulator film, the metal electrode on the one of the surfaces is covered with a metal of a different kind from that of the metal electrode by electroless plating.

Moreover, an element region having a metal electrode on each surface of a semiconductor substrate and further having a metal field plate around a perimeter of the element region is formed on one of the surfaces of the semiconductor substrate, and after the field plate is covered with an insulator film, the metal electrode on the one of the surfaces of the semiconductor substrate in the element region is covered with a metal of a different kind from that of the metal electrode by electroless plating.

Furthermore, a first metal electrode for wire bonding and a second metal electrode for soldering are to be provided on a semiconductor substrate, and after the first metal electrode for wire bonding is covered with an insulator film, the second metal electrode for soldering is covered with a metal of a different kind from those of the first and second metal electrodes by electroless plating.

Alternatively, a metal electrode is provided on each surface of a semiconductor substrate, the metal electrode on one of surfaces of the semiconductor substrate and the metal electrode on the other surface are connected to make both electrodes at the same potential, and the metal electrode on the one of the surfaces and the metal electrode on the other surface are covered with a metal of a different kind from those of the metal electrodes by electroless plating.

BRIEF DESCRIPTION OF THE DRAWINGS

The foregoing advantages and features of the invention will become apparent upon reference to the following detailed description and the accompanying drawings, of which.

DETAILED DESCRIPTION OF PREFERRED EMBODIMENTS

Figure 1:
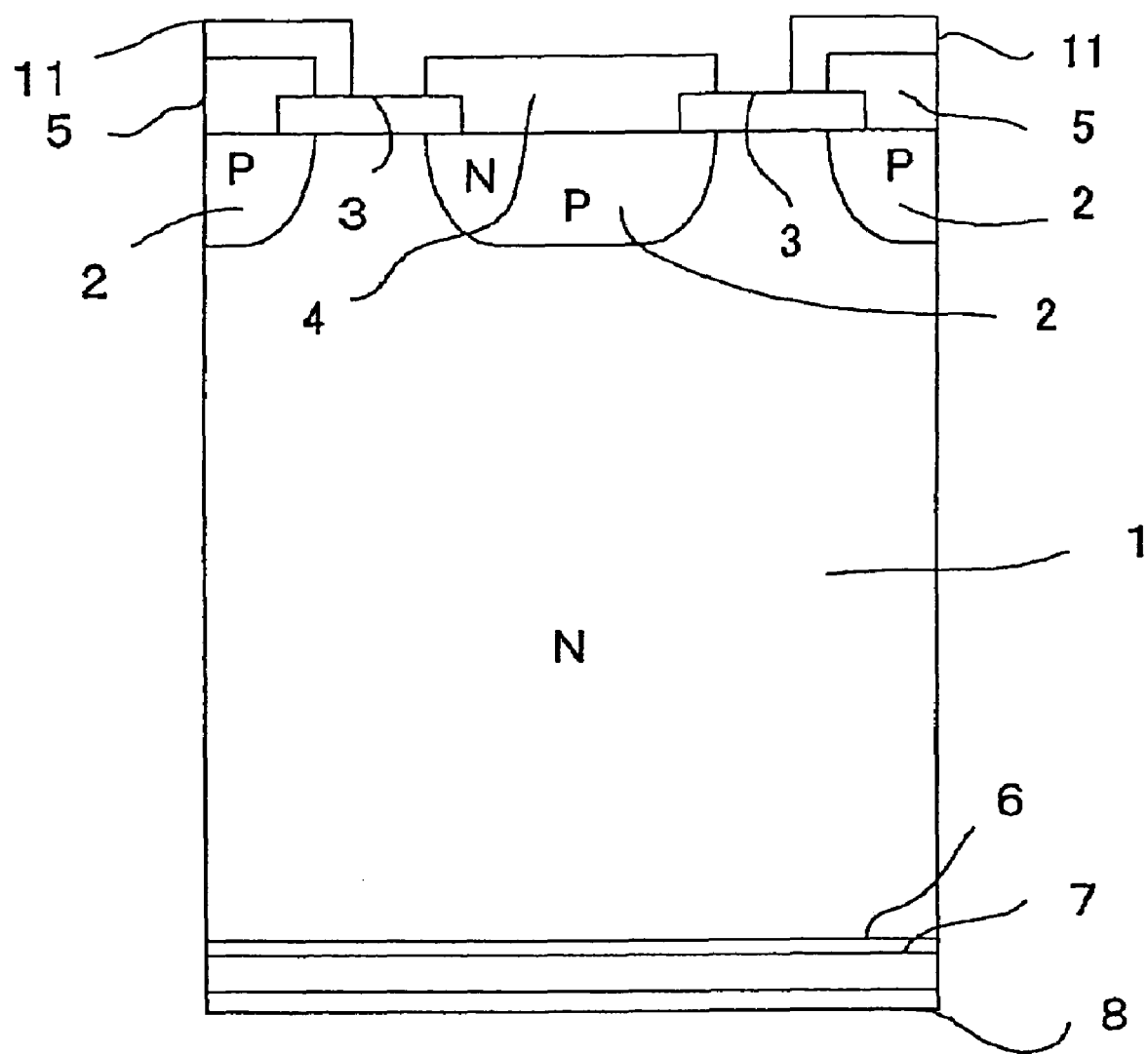
FIG. 1 is a cross sectional view showing a first example according to the invention.

FIG. 1 is a cross sectional view of a first example according to the invention. In FIG. 1, there is shown a chip of a rectifying element with P-type diffused layers 2 selectively formed on a top surface as an anode side of N-type silicon substrate 1. On a perimeter of the top surface of the element, there is provided insulator film 3, such as an oxide film. The example is shown as one of chips after a wafer comprising a plurality of chips has been separated into individual chips along scribe lines on the wafer. A scribe line (not shown) which reached P-type diffused layer 2 was provided on the wafer at section of the wafer that would become a side face of the chip. On the scribe line, there also was provided insulator film 3, such as the oxide film or insulator film 11 of polyimide or the like. Moreover, also on the side face of the wafer, an insulator film is formed. On the surface of each of P-type diffused layers 2, there is formed aluminum electrode 4 as an anode electrode, or open electrode 5 such as a field plate not connected to an external circuit thereafter. Furthermore, on the bottom surface of silicon substrate 1, a cathode electrode is formed which is a film made up of Ti layer 6, Ni layer 7 and Au layer 8 in this order from the side of N-type silicon substrate 1. Of the electrodes on the top surface as the anode side of N-type silicon substrate 1, open electrode 5 has its surface covered with insulator film 11 of polyimide or the like. Aluminum electrode 4, after being subjected to preliminary treatment such as degreasing, is plated with a layer of an alloy with Ni as a main element including phosphorus up to a thickness of the order of 3 µm. Thereafter, for preventing Ni from being oxidized, further plating is carried out with Au up to a thickness of the order of 0.2 µm to provide a double layer structure. In this example, although not shown in the figure, the scribe lines and the side face of the wafer are covered with the insulator film. Thus, no area at the same potential as that of the anode electrode is exposed on the scribe lines and the side face of the wafer. Therefore, no metallic deposit adheres onto the scribe lines and the side face of the wafer by the electroless plating. This prevents metallic deposit from adhering to the cathode side and makes it possible to form a desired plated film only on the anode side.

Figure 2:
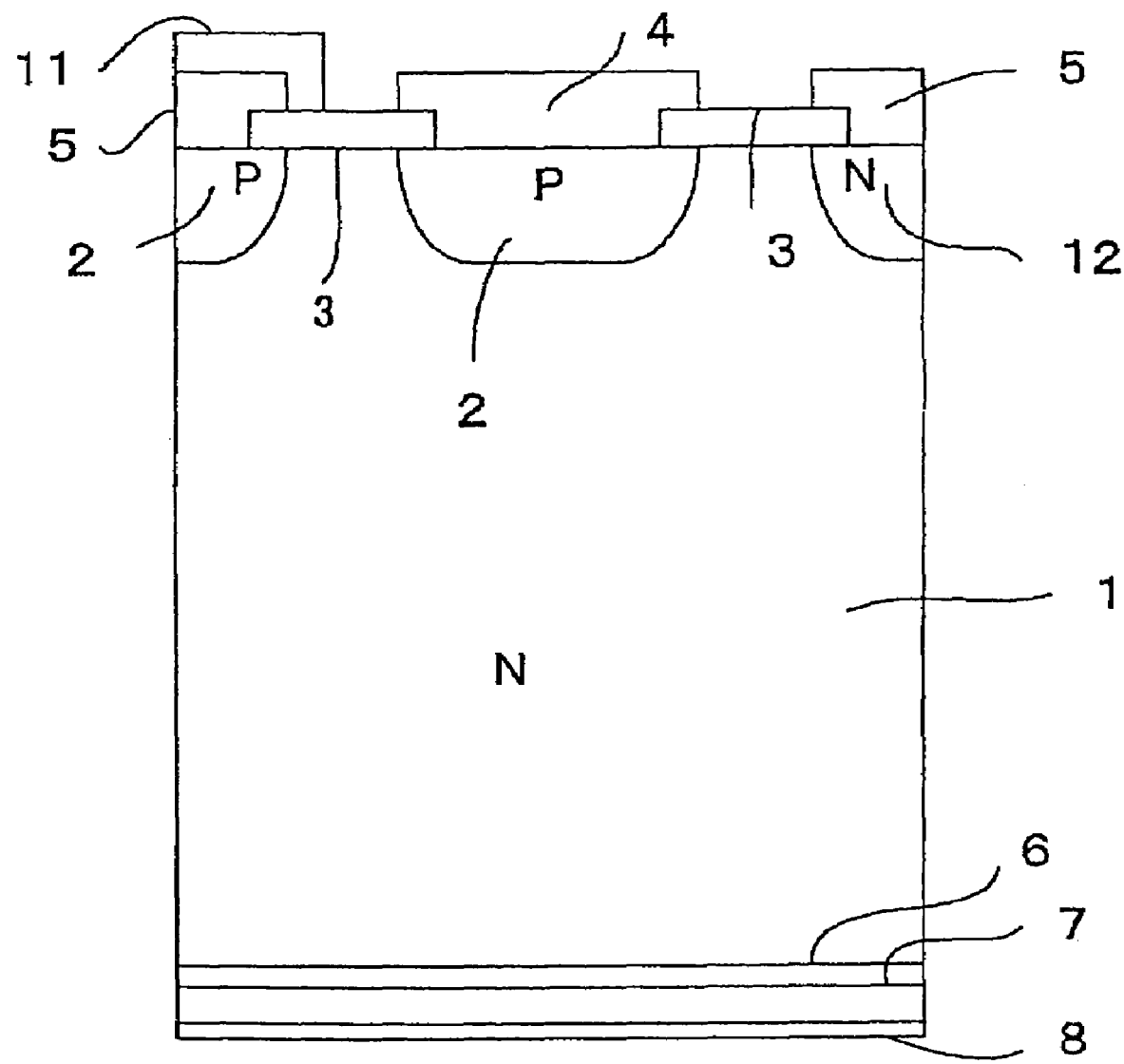
FIG. 2 is a cross sectional view showing a second example according to the invention.

FIG. 2 is a cross sectional view of a second example according to the invention. In this FIG. 2, there is shown a chip of a rectifying element with P-type diffused layers 2 and N-type diffused layer 12 selectively formed on a top surface as an anode side of N-type silicon substrate 1. On a perimeter of the top surface of the element, there is provided insulator film 3 such as an oxide film. On the surface of each of P-type diffused layers 2, there is formed aluminum electrode 4 as an anode electrode, or open electrode 5 not connected to an external circuit thereafter. Furthermore, on a surface of the cathode side, a cathode electrode is formed which is a film made up of Ti layer 6, Ni layer 7 and Au layer 8 in this order from the side near N-type silicon substrate 1. Of aluminum electrode 4 and open electrode 5 in contact with P-type diffused layers 2 on the top surface as the anode side of silicon substrate 1, open electrode 5 has its surface covered with insulator film 11. By covering with insulator film 11, no metallic deposit adheres to the covered section.

Figure 3:
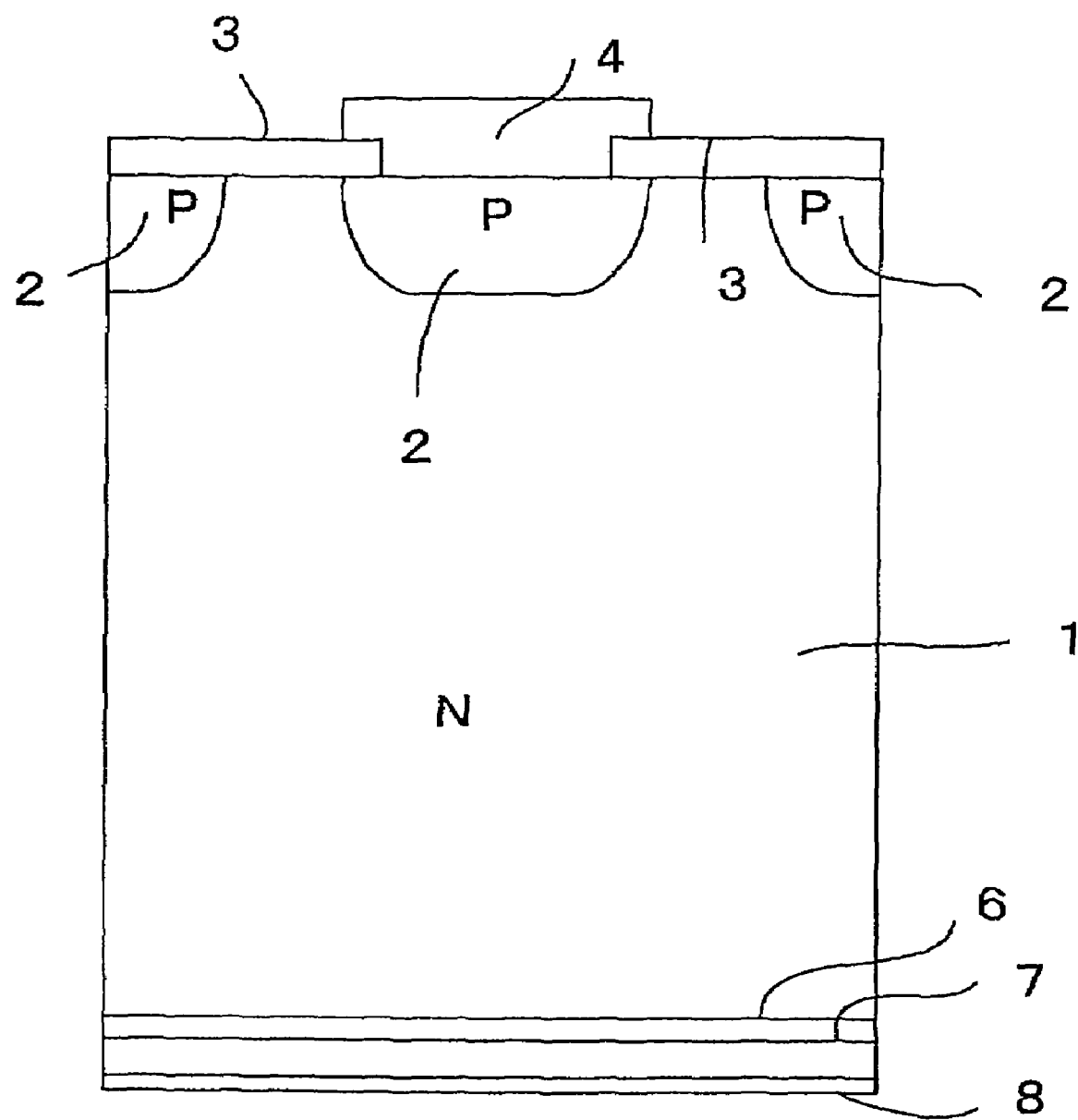
FIG. 3 is a cross sectional view showing a third example according to the invention.
Figure 4:
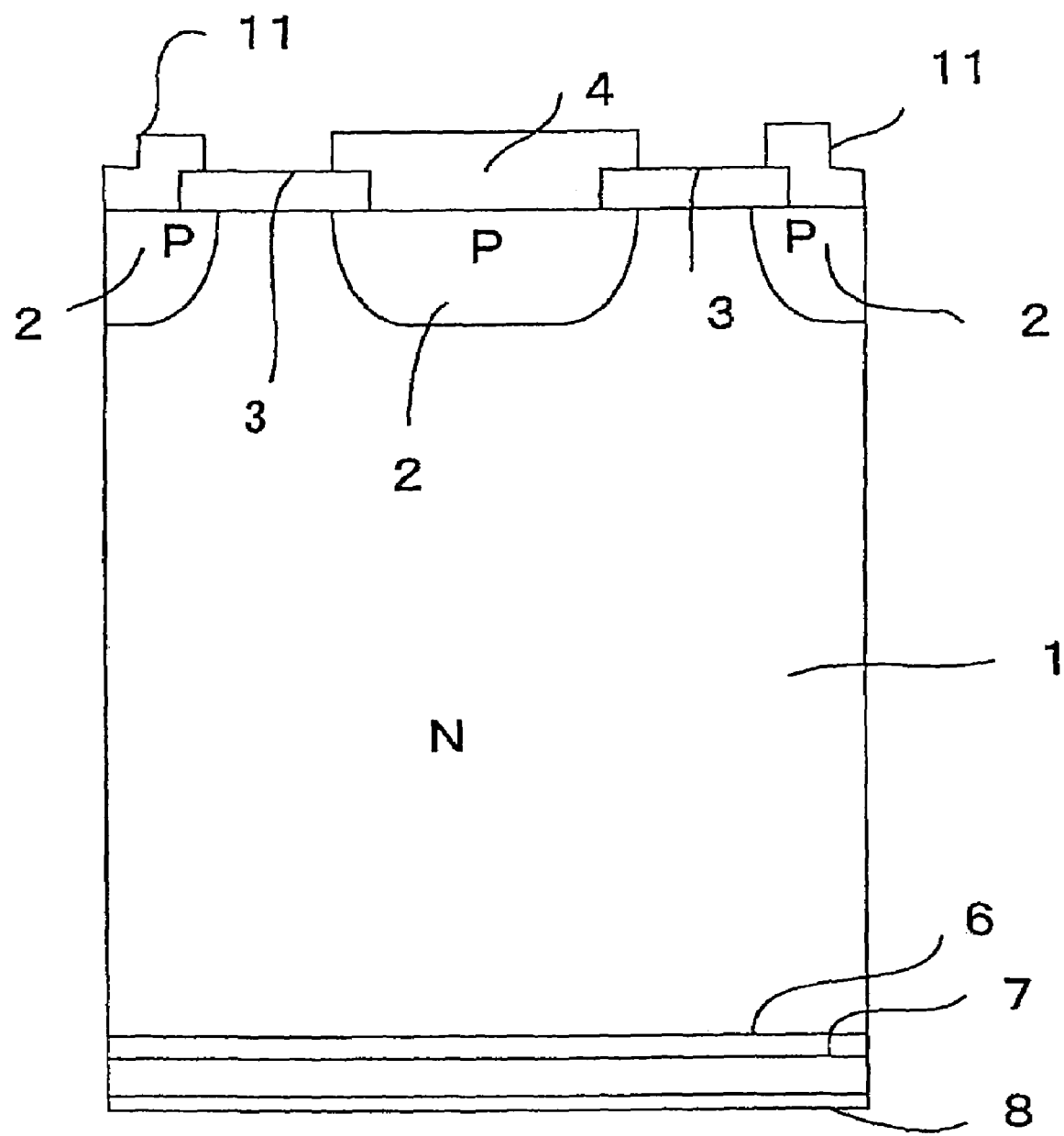
FIG. 4 is a cross sectional view showing a modification of the third example of the invention.

FIG. 3 is a cross sectional view of a third example according to the invention. FIG. 3 shows a chip of a rectifying element with P-type diffused layers 2 selectively formed on a top surface as an anode side of N-type silicon substrate 1. On a perimeter of the top surface of the element, there is provided insulator film 3 such as an oxide film. On the surface of one of P-type diffused layers 2, there is formed aluminum electrode 4 as an anode electrode. Furthermore, on a surface of the cathode side, a cathode electrode is formed which is a film comprising of Ti layer 6, Ni layer 7 and Au layer 8 in the order from the side near N-type silicon substrate 1. Of P-type diffused layers 2, those end sections having no metal electrodes thereon have their surfaces covered with insulator film 3. Moreover, FIG. 4 is a cross sectional view of a modification of the third example in which insulator film 11 is formed after the aluminum electrode 4 is formed.

Figure 6:
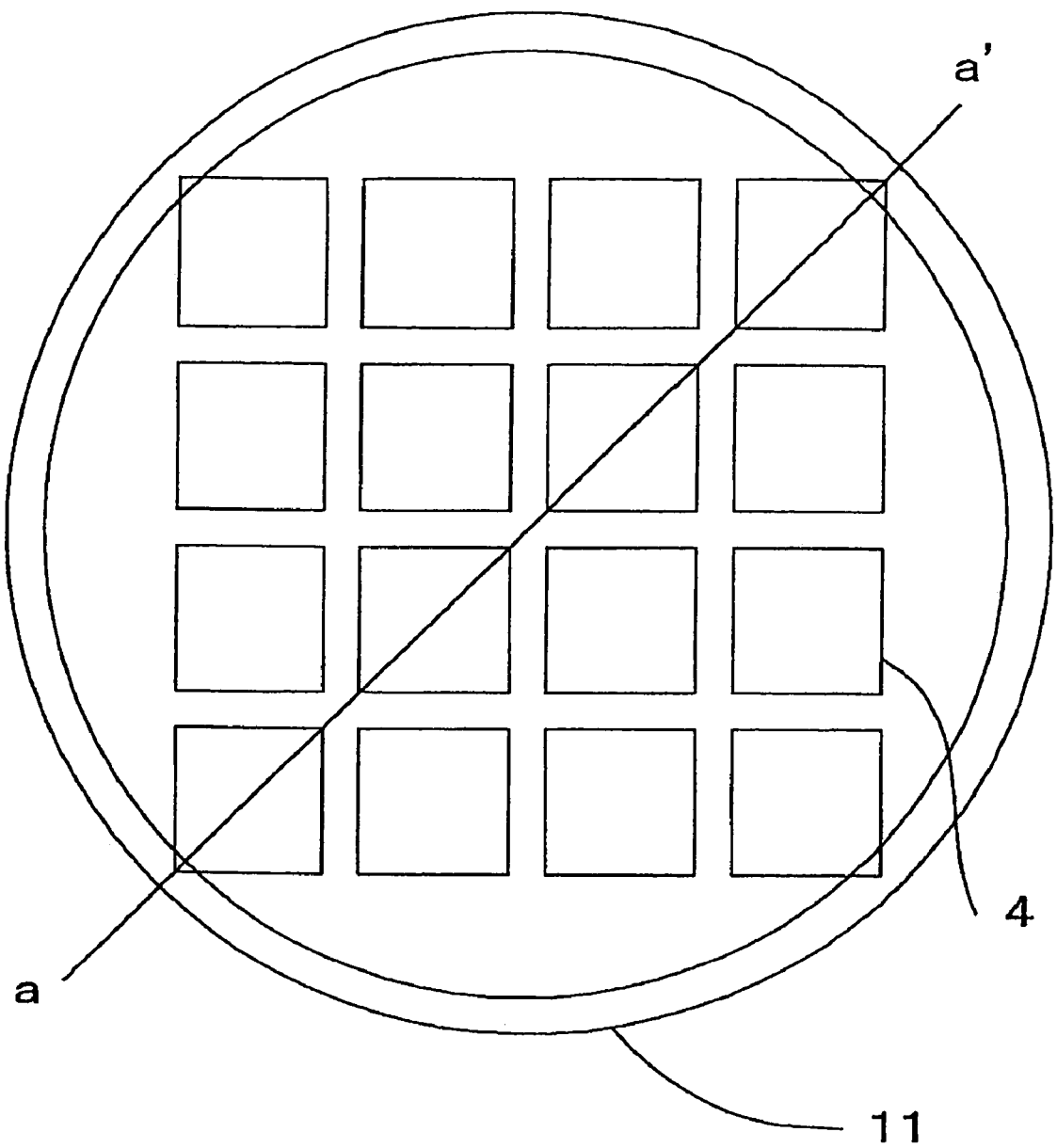
FIG. 6 is a plan view showing a fourth example according to the invention.
Figure 7:
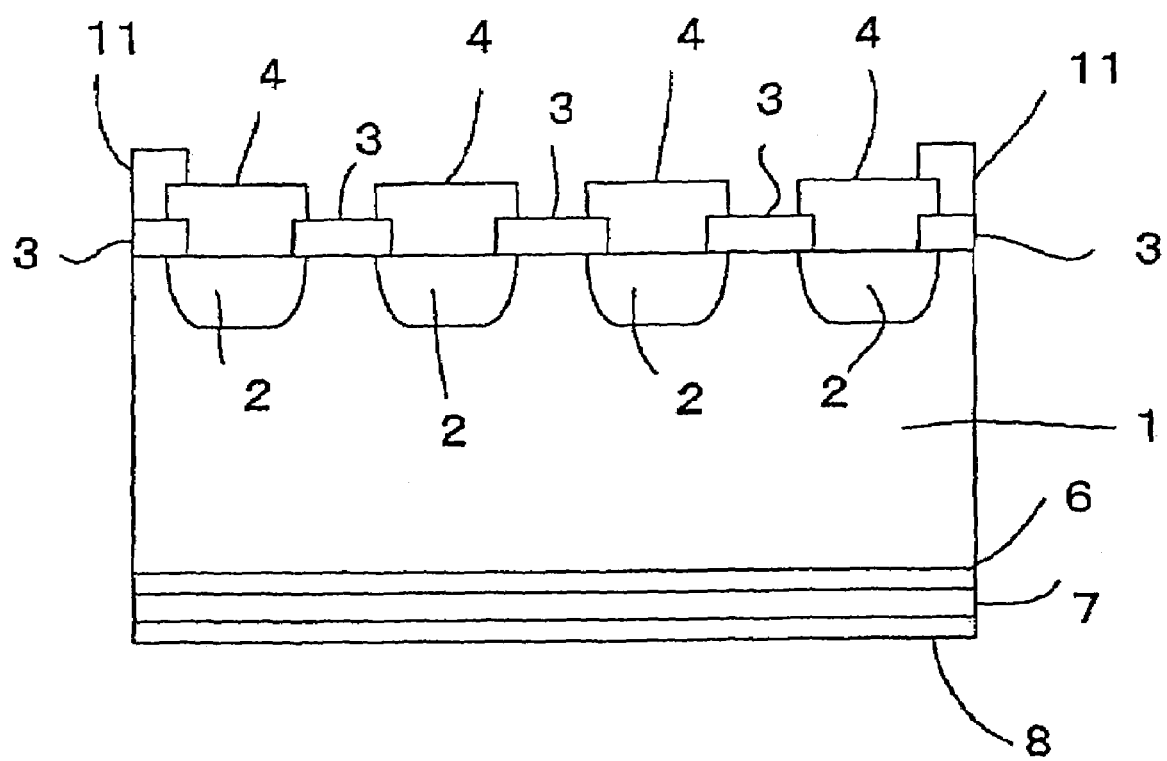
FIG. 7 is a cross sectional view taken along the line a-a' in FIG. 6.
Figure 8:
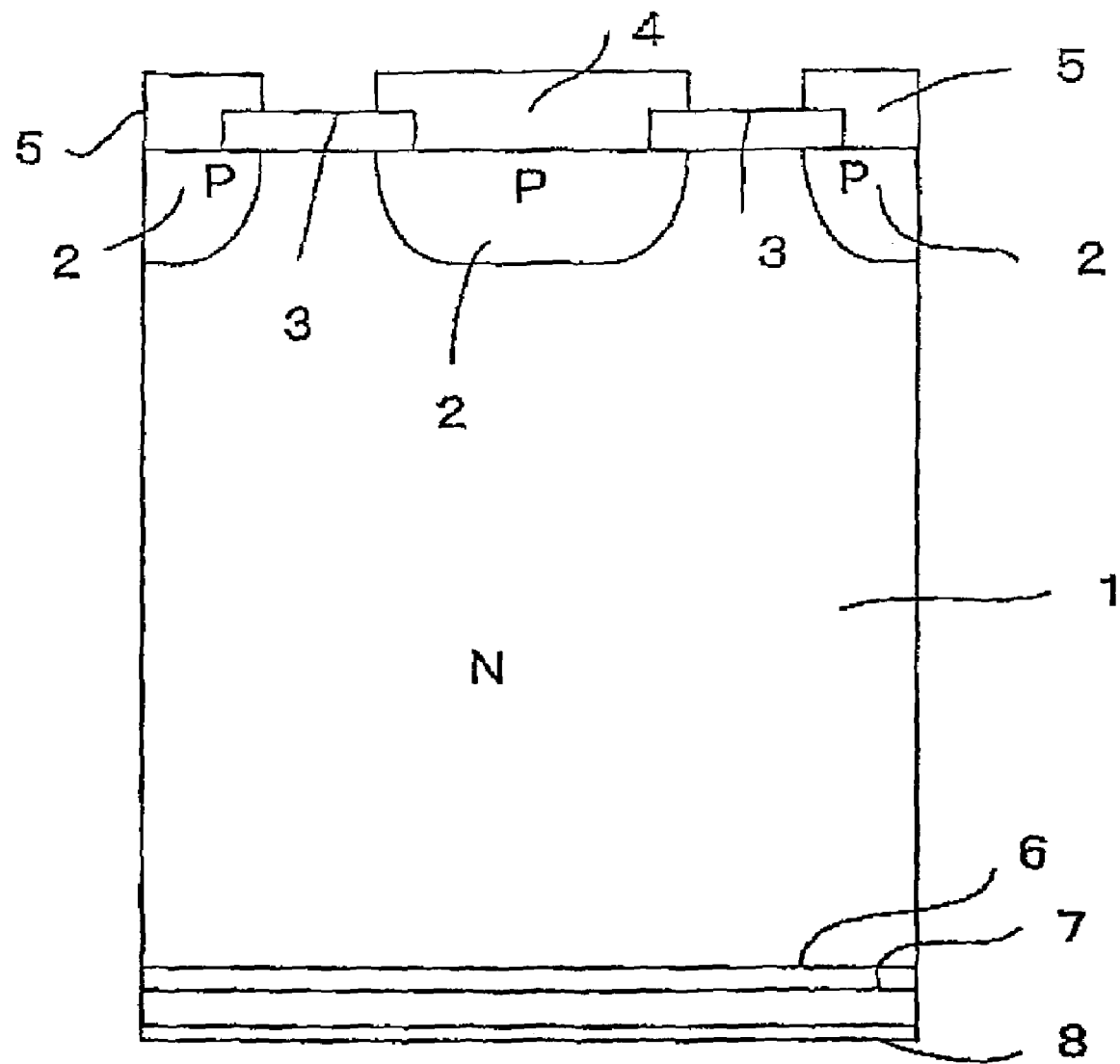
FIG. 8 is a cross sectional view of an example of a conventional device.
Figure 9:
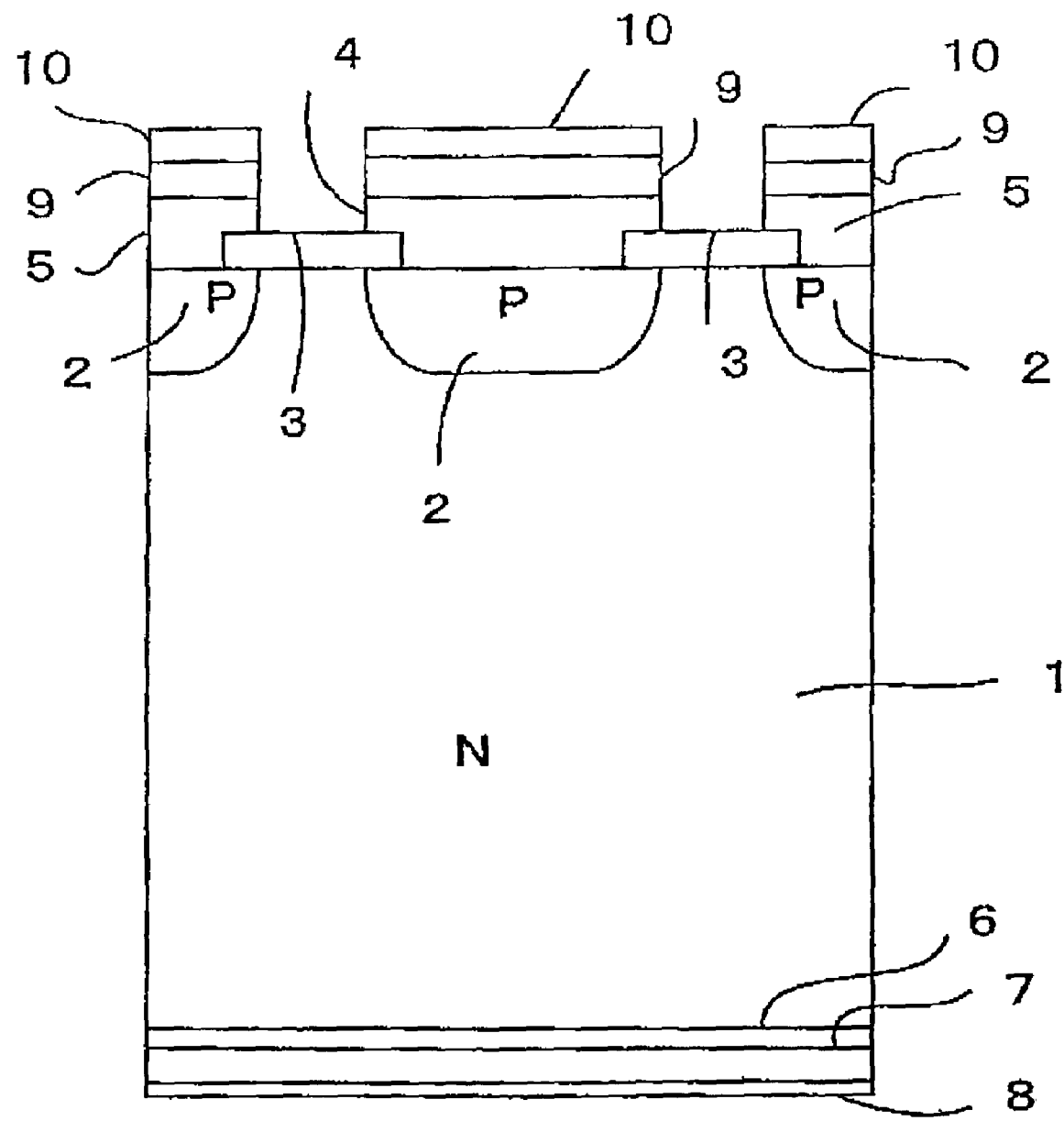
FIG. 9 is a cross sectional view of another example of a conventional device.
Figure 10:
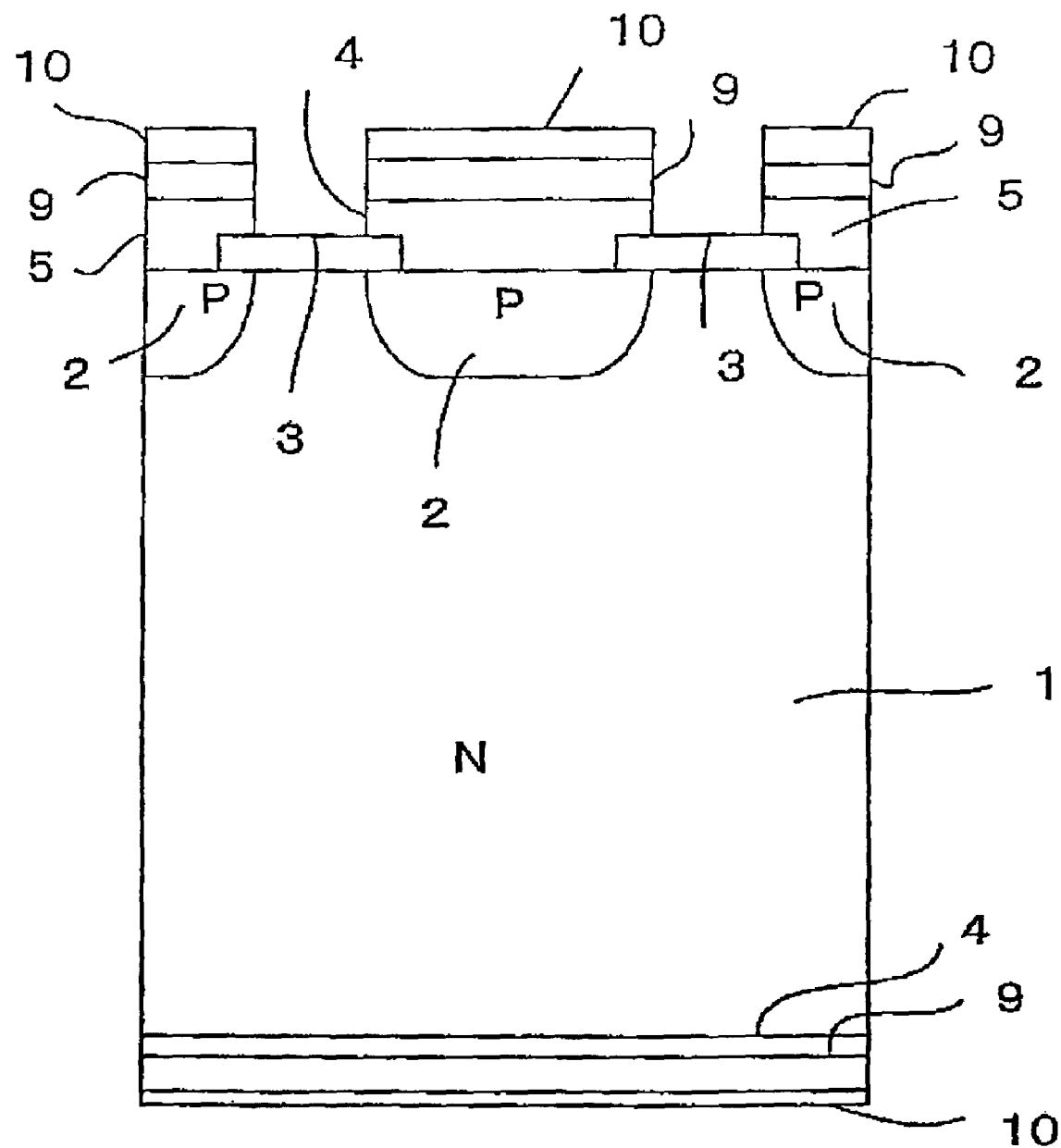
FIG. 10 is a cross sectional view of another example of a conventional device.

In FIG. 6 and FIG. 7, a fourth example according to the invention is shown. FIG. 6 is a plan view of a wafer and FIG. 7 is a cross sectional view taken along the line a-a' in FIG. 6. In these figures, there is shown a wafer with a plurality of rectifying elements arranged therein. Each of the rectifying elements is made up of P-type diffused layers 2 selectively formed on a top surface as an anode side of N-type silicon substrate 1, aluminum electrodes 4 selectively connected to P-type diffused layers 2, and a cathode electrode commonly connected to the elements on a bottom surface as a cathode side of N-type silicon substrate 1. When at least a part of an anode electrode is formed by electroless plating of covering aluminum electrode 4 with a metal different from aluminum, of the outermost perimeter of the top surface of N-type silicon substrate 1, each section with aluminum electrode 4 or P-type diffused layer 2 is made to have its surface covered with insulator film 3.

In these examples, materials being left on the surface of the wafer are oxide films or passivation films, which are not hazardous materials. Therefore, the as-manufactured wafer can be subjected to dicing to form chips without causing any problem.

Figure 5:
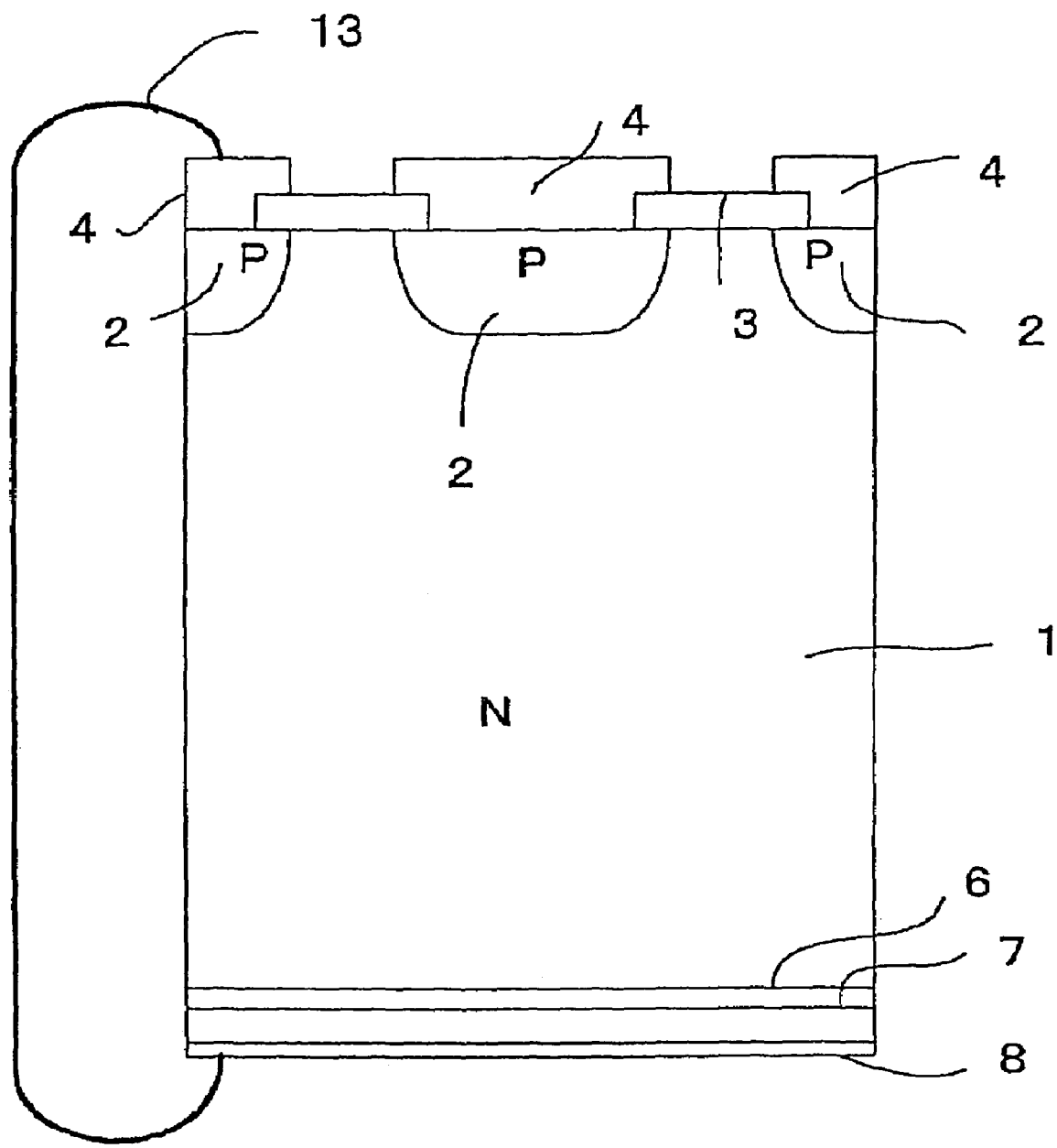
FIG. 5 is cross sectional view showing a fifth example according to the invention.

FIG. 5 is a cross sectional view showing a fifth example according to the invention. In FIG. 5, electroless plating is carried out with P-type diffused layer 2 on an anode side and a cathode electrode on a cathode side in a rectifying element being electrically short-circuited by using conductive wiring 13 or the like. In the example, a metallic deposit grows also on the cathode side from the beginning of plating. This results in simultaneous growth of metallic deposits on both surfaces of N-type silicon substrate 1, making it possible stably to provide a metallic deposit on the cathode side with a thickness that is the same as that of the metallic deposit on the anode side, with the variation in thickness being small. The method in the fifth example is effective when making the metallic deposits grow on both surfaces of N-type silicon substrate 1 rather than carrying out plating only on the anode side like the methods in the first to fourth examples.

The explanation of the invention has been carried out with a diode taken as an example. However, the invention is not limited to this, but can be also applied to, for example, power devices such as a MOSFET and an IGBT, and a power IC with MOSFETs, IGBTs and control circuits being integrated into a chip. In this case, at a position such as a main electrode to which a main terminal that allows a large current to flow is connected, the main electrode is plated for connecting the main terminal by soldering. At such a position to which a terminal like a control terminal or a signal terminal that allows a small current to flow is connected, the connection is carried out by wire bonding as usual. At this time, at the plated position, an Au layer is formed on a Ni layer. Thus, bonding of an aluminum wire on an Au surface causes a problem of formation of purple plague (the formation of an intermetallic compound of Au and Al at the Au—Al bond, which compound grows under stress at a high temperature to cause an increase in resistance or breaking of the wire). Therefore, plating of metal electrode sections to which wire bonding of control terminals and signal terminals are carried out is prevented. Moreover, plating on metal electrodes in areas other than areas where lead terminals are to be soldered to metal electrodes possibly causes solder, accidentally flowed to the area at soldering of lead terminals, to adhere to the unnecessarily plated electrodes, resulting in short-circuiting between electrodes. Therefore, plating is prevented on metal electrode sections such as the open electrode as the field plate and the signal terminals. This prevents an unnecessary increase in the thickness of the metal electrodes to thus minimize or prevent warping of the silicon substrate due to the difference in coefficient of thermal expansion between the metal electrode and the silicon substrate.

According to the invention, the first to fourth examples stably form a metallic deposit on the anode side with small variation in film thickness, and prevent the cathode side from being plated, without performing any additional processing on the cathode side, so that the processed anode side cause no interference in subsequent processing. Moreover, the fifth example stably causes a metallic deposit to grow also on the cathode side from the early stage of forming the metallic deposit by short-circuiting the anode electrode and the cathode electrode from the beginning to make both electrodes at the same potential.

Thus, a method of manufacturing a semiconductor device has been described according to the present invention. Many modifications and variations may be made to the techniques and structures described and illustrated herein without departing from the spirit and scope of the invention. Accordingly, it should be understood that the [methods and apparatus] described herein are illustrative only and are not limiting upon the scope of the invention.

What is claimed is:

1. A method of manufacturing a semiconductor device, comprising:
   providing a metal electrode on both the top and bottom surface of a semiconductor substrate, wherein the metal electrode on the top surface is an aluminum electrode, forming a scribe line on one of the surfaces of the semiconductor substrate, covering the scribe line and the side face of the semiconductor substrate with an insulator film, and then covering the metal electrode on the top surface only with a metal of a different kind from that of the metal electrode by electroless plating.

2. A method of manufacturing a semiconductor device, comprising:

forming on a top surface of a semiconductor substrate an element region having a metal electrode on each surface of the semiconductor substrate and further having a metal field plate around a perimeter of the element region, wherein the metal electrode on the top surface is an aluminum electrode, covering the field plate with an insulator film, and then covering the metal electrode on the top surface of the semiconductor substrate in the element region with a metal of a different kind from that of the metal electrode by electroless plating.

3. A method of manufacturing a semiconductor device, comprising:

providing on a semiconductor substrate a first metal electrode for wire bonding and a second metal electrode for soldering, wherein the first and second metal electrodes are aluminum electrodes, covering the first metal electrode for wire bonding with an insulator film, and then covering the second metal electrode for soldering with a metal of a different kind from those of the first and second metal electrodes by electroless plating.

4. A method of manufacturing a semiconductor device, comprising:

providing a metal electrode on both the top and bottom surface of a semiconductor substrate, wherein the metal electrode on the top surface is an aluminum electrode, connecting the metal electrode on one of the surfaces of the semiconductor substrate and the metal electrode on the opposite surface to make both electrodes at the same potential, and then covering both of the metal electrodes with a metal of a different kind from those of the metal electrodes by electroless plating.

5. The method according to claim 1, wherein the metal electrode on the top surface is the anode.

* * * * *

UNITED STATES PATENT AND TRADEMARK OFFICE
CERTIFICATE OF CORRECTION

PATENT NO. : 7,368,380 B2 Page 1 of 1
APPLICATION NO. : 10/864917
DATED : May 6, 2008
INVENTOR(S) : Seiji Momota et al.

It is certified that error appears in the above-identified patent and that said Letters Patent is hereby corrected as shown below:

On the title page item (75) "Inventors" first inventor's name change:

FROM: "Seiji MOMOTO"

TO READ: -- Seiji MOMOTA --

Signed and Sealed this

Nineteenth Day of August, 2008

JON W. DUDAS
*Director of the United States Patent and Trademark Office*